United States Patent
Nishizawa

(10) Patent No.: US 10,737,331 B2
(45) Date of Patent: Aug. 11, 2020

(54) COATED CUTTING TOOL

(71) Applicant: TUNGALOY CORPORATION, Fukushima (JP)

(72) Inventor: Hirosato Nishizawa, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 191 days.

(21) Appl. No.: 16/088,752

(22) PCT Filed: Mar. 28, 2017

(86) PCT No.: PCT/JP2017/012750
§ 371 (c)(1),
(2) Date: Sep. 26, 2018

(87) PCT Pub. No.: WO2017/170603
PCT Pub. Date: Oct. 5, 2017

(65) Prior Publication Data
US 2019/0076933 A1    Mar. 14, 2019

(30) Foreign Application Priority Data
Mar. 31, 2016 (JP) ................................. 2016-070038

(51) Int. Cl.
| | |
|---|---|
| *B23B 27/14* | (2006.01) |
| *B23C 5/16* | (2006.01) |
| *C23C 14/06* | (2006.01) |
| *B23C 5/10* | (2006.01) |
| *B23C 5/20* | (2006.01) |
| *C23C 30/00* | (2006.01) |
| *C23C 28/04* | (2006.01) |

(52) U.S. Cl.
CPC ............ *B23B 27/143* (2013.01); *B23B 27/14* (2013.01); *B23C 5/1009* (2013.01); *B23C 5/16* (2013.01); *B23C 5/205* (2013.01); *C23C 14/06* (2013.01); *C23C 14/0641* (2013.01); *C23C 30/005* (2013.01); *B23B 2222/28* (2013.01); *C23C 28/044* (2013.01)

(58) Field of Classification Search
USPC ........... 51/307, 309; 428/336, 697, 698, 699
See application file for complete search history.

(56) References Cited

U.S. PATENT DOCUMENTS

| | | | |
|---|---|---|---|
| 8,409,702 B2 * | 4/2013 | Ni | C23C 14/0641 51/307 |
| 2009/0123779 A1 * | 5/2009 | Endler | C23C 30/005 428/697 |
| 2015/0211105 A1 * | 7/2015 | Schier | C23C 14/0641 428/336 |

FOREIGN PATENT DOCUMENTS

JP    2015-182153 A    10/2015

OTHER PUBLICATIONS

International Preliminary Report on Patentability and Written Opinion issued in PCT/JP2017/012750; dated Oct. 2, 2018.
International Search Report issued in PCT/JP2017/012750; dated Jun. 20, 2017.

* cited by examiner

*Primary Examiner* — Archene A Turner
(74) *Attorney, Agent, or Firm* — Studebaker & Brackett PC

(57) ABSTRACT

Provided is a coated cutting tool, comprising: a substrate; and a coating layer formed on at least part of a surface of the substrate. The coating layer includes at least one composite nitride layer including a compound having a composition represented by $(Ti_xAl_y)N$ [x denotes an atomic ratio of a Ti element based on a total of the Ti element and an Al element, y denotes an atomic ratio of the Al element based on a total of the Ti element and the Al element, and $0.10 \leq x \leq 0.50$, $0.50 \leq y \leq 0.90$, and $x+y=1$ are satisfied]. The composite nitride layer includes a phase having a lattice constant of from 0.400 nm or more to 0.430 nm or less, and a phase having a lattice constant of from 0.755 nm or more to 0.810 nm or less.

20 Claims, No Drawings

COATED CUTTING TOOL

TECHNICAL FIELD

The present invention relates to a coated cutting tool.

BACKGROUND ART

In recent years, a cutting tool having a longer tool life than conventional ones has been required, along with an increase in demand for more highly efficient cutting. Thus, in terms of the performance required for tool materials, improvements of wear resistance and fracture resistance, which are related to the life of a cutting tool, have been becoming increasingly important. In view of this, in order to improve such characteristics, a coated cutting tool is widely used which includes: a substrate formed of a cemented carbide, cermet, cBN, or the like; and a coating layer provided on the surface of the substrate, the coating layer consisting of one layer or two or more layers each formed of a TiN layer, a TiAlN layer, or the like.

Various techniques have been proposed in order to improve the characteristics of the above-described coating layer. For example, Patent Document 1 proposes a coated cutting tool formed of a composite nitride layer of Al and Ti, in which the lattice constant of the composite nitride layer of Al and Ti takes a value in a range of from −0.057x+4.18 (Å) to −0.057x+4.24 (Å) (x denotes the content of Al and satisfies $0.40 \leq x \leq 0.75$), and a ratio I (200)/I (111) of a diffraction peak intensity I (200) of a plane (200) to a diffraction peak intensity I (111) of a plane (111) of the composite nitride layer of Al and Ti, which is obtained through X-ray diffraction, is three or more.

CITATION LIST

Patent Documents

Patent Document 1: JP-2015-182153 A

SUMMARY

Technical Problem

In cutting in recent years, a cutting speed, a feeding speed, and a cut-in depth have been remarkably increased, and tools are often fractured due to cracks caused in a tool surface by loads placed on a cutting edge during machining and developed toward a substrate, or due to cracks caused in the substrate by an abrupt increase or decrease in temperature of the cutting edge and developed toward a coating layer.

The invention of Patent Document 1 has high wear resistance but cannot deal with the above-mentioned circumstances of cutting in recent years, and hence fracturing of the tool is likely to occur, which is a problem.

The present invention has been made in order to solve these problems, and an object of the present invention is to provide a coated cutting tool which involves an improvement of fracture resistance without a reduction in wear resistance, and thus has a long tool life.

Solution to Problem

The present inventor has conducted studies regarding extension of the tool life of a coated cutting tool and have accordingly found that specific configurations of a coated cutting tool allow the fracture resistance of the coated cutting tool to be improved without a reduction in wear resistance, and found that the tool life of the coated cutting tool can be extended as a result. The present inventor has completed the present invention based on such findings.

Specifically, the gist of the present invention is as set forth below.

[1] A coated cutting tool, comprising:
a substrate; and
a coating layer formed on at least part of a surface of the substrate, wherein:
the coating layer includes at least one composite nitride layer including a compound having a composition represented by formula (1) below:

$$(Ti_xAl_y)N \tag{1}$$

(wherein, x denotes an atomic ratio of a Ti element based on a total of the Ti element and an Al element, y denotes an atomic ratio of the Al element based on a total of the Ti element and the Al element, and $0.10 \leq x \leq 0.50$, $0.50 \leq y \leq 0.90$, and $x+y=1$ are satisfied); and
the composite nitride layer includes a phase having a lattice constant of from 0.400 nm or more to 0.430 nm or less, and a phase having a lattice constant of from 0.755 nm or more to 0.810 nm or less.

[2] The coated cutting tool according to [1], wherein the composite nitride layer includes a phase having a crystal system of a cubic crystal and a lattice constant of from 0.410 nm or more to 0.430 nm or less, and a phase having a crystal system of a cubic crystal and a lattice constant of from 0.760 nm or more to 0.800 nm or less.

[3] The coated cutting tool according to [1] or [2], wherein the composite nitride layer includes a phase having a lattice constant of from 0.410 nm or more to 0.420 nm or less, and a phase having a lattice constant of from 0.770 nm or more to 0.795 nm or less.

[4] The coated cutting tool according to any one of [1] to [3], wherein:
the composite nitride layer includes a crystal of (Ti,Al)N, which is a cubic crystal, or the crystal of (Ti,Al)N, which is the cubic crystal, and a crystal of AlN, which is a hexagonal crystal; and
a ratio [hexagonal crystal I (100)/cubic crystal I (200)] of a diffraction peak intensity I (100) of a hexagonal crystal plane (100) to a diffraction peak intensity I (200) of a cubic crystal plane (200), which is obtained through X-ray diffraction, is 0.5 or less.

[5] The coated cutting tool according to any one of [1] to [4], wherein the composite nitride layer has a residual stress of from −4.0 GPa or higher to 2.0 GPa or lower.

[6] The coated cutting tool according to any one of [1] to [5], wherein the composite nitride layer has an average thickness of from 1.5 μm or more to 12.0 μm or less.

[7] The coated cutting tool according to any one of [1] to [6], wherein:
the coating layer includes a lower layer between the substrate and the composite nitride layer;
the lower layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the lower layer has an average thickness of from 0.1 μm or more to 3.5 μm or less.

[8] The coated cutting tool according to any one of [1] to [7], wherein:
the coating layer includes an upper layer on an opposite side of the composite nitride layer to the substrate;
the upper layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the upper layer has an average thickness of from 0.1 μm or more to 3.5 μm or less.

[9] The coated cutting tool according to any one of [1] to [8], wherein an entire coating layer has an average thickness of from 1.5 μm or more to 15.0 μm or less.

[10] The coated cutting tool according to any one of [1] to [9], wherein the substrate is a cemented carbide, cermet, ceramics, or a cubic boron nitride sintered body.

Advantageous Effects of Invention

According to the present invention, it is possible to provide the coated cutting tool which involves an improvement of fracture resistance without a reduction in wear resistance, and thus has a long tool life.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool of the present embodiment includes a substrate and a coating layer formed on the surface of the substrate. The substrate in the present embodiment is not particularly limited, as long as it may be used as a substrate for the coated cutting tool. Examples of the substrate include a cemented carbide, cermet, ceramics, a cubic boron nitride sintered body, a diamond sintered body, and high-speed steel. From among the above examples, the substrate is further preferably at least one kind selected from the group consisting of a cemented carbide, cermet, ceramics, and a cubic boron nitride sintered body because further excellent wear resistance and fracture resistance can be provided.

In the coated cutting tool of the present embodiment, the wear resistance tends to be further improved when the average thickness of the entire coating layer is 1.5 μm or more. Meanwhile, the fracture resistance tends to be further improved when the average thickness of the entire coating layer is 15.0 μm or less. Thus, the average thickness of the entire coating layer is preferably from 1.5 μm or more to 15.0 μm or less. In particular, from the same perspective as that set forth above, the average thickness of the entire coating layer is more preferably from 2.0 μm or more to 10.0 μm or less.

The coating layer of the present embodiment may be a single layer or a multilayer of two or more layers, but at least one layer of the coating layer is a specific layer (hereinafter referred to as the "composite nitride layer") described below. The composite nitride layer according to the present embodiment includes a compound having a composition represented by formula (1) below and therefore has excellent oxidation resistance.

$(Ti_xAl_y)N$ (1)

In the composite nitride layer of the present embodiment, the compound having the composition represented by formula (1) above preferably contains a cubic crystal, or a cubic crystal and a hexagonal crystal. In formula (1) above, x denotes an atomic ratio of a Ti element based on a total of the Ti element and an Al element, y denotes an atomic ratio of the Al element based on a total of the Ti element and the Al element, and $0.10 \leq x \leq 0.50$, $0.50 \leq y \leq 0.90$, and $x+y=1$ are satisfied. When the atomic ratio y of the Al element is 0.50 or more, the content of Al is large, and hence a reduction in oxidation resistance can be further prevented. When the atomic ratio y of the Al element is 0.90 or less, the abundance ratio of the hexagonal crystal is kept low, and hence a reduction in wear resistance can be further prevented. In particular, to achieve a more excellent balance between the oxidation resistance and the wear resistance, y is preferably from 0.60 or more to 0.85 or less, more preferably from 0.65 or more to 0.85 or less, still more preferably from 0.65 or more to 0.80 or less.

In the present embodiment, when the composition of the composite nitride layer is represented by $(Ti_{0.35}Al_{0.65})N$, such representation indicates that the atomic ratio of the Ti element based on a total of the Ti element and the Al element is 0.35, and that the atomic ratio of the Al element based on a total of the Ti element and the Al element is 0.65. That is, such representation indicates that the amount of the Ti element based on a total of the Ti element and the Al element is 35 atom %, and that the amount of the Al element based on a total of the Ti element and the Al element is 65 atom %.

In the present embodiment, when the average thickness of the composite nitride layer is 1.5 μm or more, a reduction in wear resistance can be more prevented. When the average thickness of the composite nitride layer is 12.0 μm or less, a reduction in fracture resistance can be further prevented. Thus, the average thickness of the composite nitride layer is preferably from 1.5 μm or more to 12.0 μm or less. In particular, from the same perspective as that set forth above, the average thickness of the composite nitride layer is more preferably from 1.5 μm or more to 10.0 μm or less, still more preferably from 2.0 μm or more to 8.0 μm or less.

The coating layer of the present embodiment may only include the composite nitride layer, but preferably includes a lower layer between the substrate and the composite nitride layer (that is, lower part of composite nitride layer) because adhesion between the substrate and the composite nitride layer is further improved. In particular, from the same perspective as that set forth above, the lower layer preferably includes a compound containing an element of at least one kind selected from the group consisting of Ti, Zr, Hf, V, Nb, Ta, Cr, Mo, W, Al, Si, and, Y, and an element of at least one kind selected from the group consisting of C, N, O, and B. The lower layer more preferably includes a compound containing an element of at least one kind selected from the group consisting of Ti, V, Nb, Cr, Mo, W, Al, and Si, and an element of at least one kind selected from the group consisting of C, N, O, and B. The lower layer still more preferably includes a compound containing an element of at least one kind selected from the group consisting of Ti, V, Nb, Cr, Mo, W, Al, and Si, and N. Further, the lower layer may be a single layer or a multilayer (laminate) of two or more layers.

In the present embodiment, the average thickness of the lower layer is preferably from 0.1 μm or more to 3.5 μm or less because the adhesion between the substrate and the coating layer tends to be further improved. From the same perspective, the average thickness of the lower layer is more preferably from 0.3 µm or more to 3.0 µm or less, still more preferably from 0.5 µm or more to 3.0 µm or less.

The coating layer of the present embodiment may include an upper layer on the side of the composite nitride layer that is opposed to the substrate (that is, upper part of composite nitride layer), and preferably on the surface of the composite nitride layer. The upper layer further preferably includes a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B because further excellent wear resistance can be provided. Further, from the same perspective as that set forth above, the upper layer more preferably includes a compound containing an element of at least one kind selected from the group consisting of Ti, Nb, Cr, Mo, W, Al, and Si, and an element of at least one kind selected from the group consisting of C, N, O, and B. The upper layer still more preferably includes a compound containing an element of at least one kind selected from the group consisting of Ti, Nb, Cr, Mo, W, Al, and Si, and N. Further, the upper layer may be a single layer or a multilayer (laminate) of two or more layers.

In the present embodiment, the average thickness of the upper layer is preferably from 0.1 µm or more to 3.5 µm or less because the wear resistance tends to be excellent. From the same perspective, the average thickness of the upper layer is more preferably from 0.2 µm or more to 2.0 µm or less, still more preferably from 0.3 µm or more to 1.0 µm or less.

When the composite nitride layer in the coated cutting tool of the present embodiment includes a phase having a lattice constant of from 0.400 nm or more to 0.430 nm or less, the composite nitride layer is dense, which gives excellent wear resistance to the coated cutting tool. Further, when the composite nitride layer of the coated cutting tool of the present embodiment includes a phase having a lattice constant of from 0.755 nm or more to 0.810 nm or less, there is an effect to prevent the development of cracks caused during machining, which gives excellent fracture resistance to the coated cutting tool. From the same perspective, the above-mentioned composite nitride layer preferably includes a phase having a lattice constant of from 0.410 nm or more to 0.430 nm or less, and a phase having a lattice constant of from 0.760 nm or more to 0.800 nm or less. The composite nitride layer more preferably includes a phase having a lattice constant of from 0.410 nm or more to 0.420 nm or less, and a phase having a lattice constant of from 0.770 nm or more to 0.795 nm or less.

In the composite nitride layer of the coated cutting tool of the present embodiment, the crystal system of the phase having the lattice constant of from 0.400 nm or more to 0.430 nm or less is preferably a cubic crystal because the composite nitride layer tends to have further excellent wear resistance. Further, in the composite nitride layer of the coated cutting tool of the present embodiment, the crystal system of the phase having the lattice constant of from 0.755 nm or more to 0.810 nm or less is preferably a cubic crystal because the composite nitride layer tends to have further excellent wear resistance. From the same perspective, in the above-mentioned composite nitride layer, both the crystal system of the phase having the lattice constant of from 0.410 nm or more to 0.430 nm or less, and the crystal system of the phase having the lattice constant of from 0.760 nm or more to 0.800 nm or less are preferably cubic crystals. Both the crystal system of the phase having the lattice constant of from 0.410 nm or more to 0.420 nm or less, and the crystal system of the phase having the lattice constant of from 0.770 nm or more to 0.795 nm or less are more preferably cubic crystals.

The composite nitride layer in the coated cutting tool of the present embodiment preferably includes a crystal of (Ti,Al)N, which is a cubic crystal, or the crystal of (Ti,Al)N, which is the cubic crystal, and a crystal of AlN, which is a hexagonal crystal. The ratio of a diffraction peak intensity I (100) of a hexagonal crystal plane (100) to a diffraction peak intensity I (200) of a cubic crystal plane (200) (hereinafter referred to as the "hexagonal crystal I (100)/cubic crystal I (200)"), which is obtained through X-ray diffraction, is preferably 0.5 or less. With this, the abundance ratio of the crystal of AlN, which is the hexagonal crystal, is low, and the coated cutting tool has further excellent wear resistance. From the same perspective, the hexagonal crystal I (100)/ cubic crystal I (200) of the above-mentioned composite nitride layer is more preferably 0.3 or less.

The diffraction peak intensity of each plane index, the lattice constant, and the crystal system in the composite nitride layer of the present embodiment can be obtained using a commercially available X-ray diffractometer. For example, the diffraction peak intensity of each plane index described above can be measured by measuring X-ray diffraction by a 2θ/θ focusing optical system with Cu-Kα radiation, using an X-ray diffractometer RINT TTRIII (product name) manufactured by Rigaku Corporation under the following conditions. Here, the measurement conditions are as follows: an output: 50 kV and 250 mA; an incident-side solar slit 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 15° to 80°. The diffraction peak intensity of each plane index described above may be obtained from an X-ray diffraction pattern using analysis software attached to the X-ray diffractometer. With analysis software, each diffraction peak intensity and lattice spacing can be obtained through background processing and removal of a Kα2 peak with the use of a cubic spline, and profile fitting using the Pearson-VII function.

The lattice constants can be obtained from relational expressions (described below) between the obtained lattice spacing and the lattice constants.

$2d = \lambda / \sin\theta$      Bragg equation:

$a^2 = d^2 \times (h^2 + k^2 + l^2)$      A case of a cubic crystal:

$a^2 = d^2 \times \{4/3 \times (h^2 + k^2 + l^2) + l^2 \times (c/a)^2\}$      A case of a hexagonal crystal:

In the expressions, d denotes lattice spacing, λ denotes the wavelength of a X-ray tube used in the measurement, θ denotes an incident angle, a denotes a lattice constant, and h, k, and l denote plane indices.

When the lower layer is formed on the substrate side of the composite nitride layer, each diffraction peak intensity can be measured by thin film X-ray diffraction so that the lower layer does not affect the measurement. Further, when the upper layer is formed on the front surface side of the composite nitride layer, the upper layer may be removed by buffing so that the upper layer does not affect the measurement.

The lattice spacing and the crystal system in the composite nitride layer of the present embodiment can be derived using a commercially available transmission electron microscope (TEM). For example, a thin-film sample having an observation surface being a cross-sectional surface of the coating layer is produced using a focused ion beam (FIB) machining apparatus manufactured by FEI Company, and measurement can be performed using a TEM apparatus Tecnai Osiris (product name) manufactured by FEI Company. The crystal systems of crystal grains contained in the composite nitride layer can be derived from a selected area diffraction (SAD) image obtained by irradiating a region of the composite nitride layer with an electron beam having a spot diameter corresponding to the thickness of the composite nitride layer. The lattice spacing and the crystal system of each crystal grain forming the composite nitride layer may be derived through irradiation of an electron beam corresponding to the size of each crystal grain. The lattice spacing and the crystal system of the composite nitride layer may be derived using Fourier transform software attached to the apparatus. For example, each diffraction plane index and lattice spacing can be measured using analysis software manufactured by Gatan, Inc. When analysis software is used, an image is taken preferably at a magnification allowing a lattice image of a measurement part to be observed, and more preferably at a magnification of 500,000 or more. In measurement of lattice spacing, a Fourier transform image (hereinafter referred to as the "FFT image") can be obtained by performing Fourier transform with the use of the software at resolutions of 512×512 pixels, 1024×1024 pixels, or 2048×2048 pixels. The lattice spacing can be derived from a distance between a transmitted wave (center spot) obtained at the center of the FFT image and a diffraction spot. The lattice constant can be obtained by identifying a crystal system from the ratio of distances each of which is the lattice spacing derived from the FFT image. Specifically, the lattice constant can be obtained by substituting the lattice spacing to a relational expression between a lattice constant and lattice spacing obtained for the identified crystal system. It is preferred that when the thin-film sample of the composite nitride layer of the present embodiment is observed, the thin-film sample includes one or more phases having a lattice constant of from 0.755 nm or more to 0.810 nm or less in a range of 1 μm×1 μm.

When the residual stress in the composite nitride layer of the present embodiment is −4.0 GPa or higher, there is a tendency that the coating layer itself can be further prevented from being peeled off. When the residual stress is 2.0 GPa or lower, the wear resistance tends to be improved. Thus, the residual stress in the composite nitride layer is preferably from −4.0 GPa or higher to 2.0 GPa or lower, more preferably from −2.0 GPa or higher to 1.0 GPa or lower, still more preferably from −2.0 GPa or higher to 0.5 GPa or lower.

The above-mentioned "residual stress" is internal stress (inherent strain) remaining in the coating layer. In general, stress represented by a "−" (negative) value is called compressive stress, whereas stress represented by a "+" (positive) value is called tensile stress. In the present invention, with regard to the magnitude of residual stress, the residual stress is represented as being large when a "+" (positive) value is large, whereas the residual stress is represented as being small when a "−" (negative) value is large.

The above-mentioned residual stress can be measured by the $\sin^2 \psi$ method using an X-ray diffractometer. The residual stress can be measured by measuring stresses at any ten points in a section involved in cutting (these points are preferably selected to have a distance of 0.5 mm or more therebetween so that the points can represent stress in the section) by the $\sin^2 \psi$ method, and obtaining the average value thereof. As to an intercept (undistorted angle), a value to be used is calculated in accordance with the composition ratio, using the diffraction angles indicated on the ICDD cards No. 00-006-0642 and No. 00-046-1200 (corresponding to cubic crystal TiN and cubic crystal AlN, respectively).

Specifically, when the composition of the composite nitride layer is $(Al_aTi_{1-a})N$, an undistorted angle (2θ) of a cubic crystal plane (111) can be calculated by the following expression.

$$\text{Undistorted angle}(2\theta) = T_{2\theta} + (Aa) \cdot (A_{2\theta} - T_{2\theta})$$

In the expression, $T_{2\theta}$ denotes a diffraction angle (36.81°) of a plane (111) of the cubic crystal TiN, $A_{2\theta}$ denotes a diffraction angle (38.53°) of a plane (111) of the cubic crystal AlN, and Aa denotes an atomic ratio (a) of the Al element based on a total of the Al element and the Ti element.

Thus, when the composition of the composite nitride layer is $(Al_{0.7}Ti_{0.3})N$, the undistorted angle (2θ) of the cubic crystal plane (111) is 38.01°.

A method of manufacturing the coating layer in the coated cutting tool of the present embodiment is not particularly limited. Examples of the method include physical vapor deposition methods, such as an ion plating method, an arc ion plating method, a sputtering method, and an ion mixing method. The coating layer is preferably formed by a physical vapor deposition method because sharp edges can be formed. In particular, the arc ion plating method achieves further excellent adhesion between the coating layer and the substrate, and is thus more preferred.

A method of manufacturing a coated cutting tool of the present embodiment will now be described using specific examples. It should be noted that the method of manufacturing a coated cutting tool of the present embodiment is not particularly limited, as long as the configurations of the coated cutting tool may be achieved.

Firstly, a substrate machined into a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature thereof reaches from 200° C. to 700° C. After the heating, an Ar gas is introduced into the reactor so that the pressure therein is from 0.5 Pa to 5.0 Pa. In the Ar gas atmosphere with a pressure of from 0.5 Pa to 5.0 Pa, a bias voltage of from −350 V to −500 V is applied to the substrate, and a current of from 40 A to 50 A is caused to flow through a tungsten filament in the reactor, whereby an ion bombardment process is carried out on the surface of the substrate with the Ar gas. After the ion bombardment process is carried out on the substrate surface, the reactor is evacuated until the pressure therein indicates a vacuum of $1.0 \times 10^{-2}$ Pa or lower.

Then, the substrate is controlled so that the temperature thereof reaches from 150° C. to 400° C. A nitrogen gas ($N_2$), an argon gas (Ar), and a xenon gas (Xe) are introduced into the reactor, and the pressure in the reactor is adjusted so as to be from 1.0 Pa to 4.0 Pa. Thereafter, a bias voltage of from −40 V to −100 V is applied to the substrate, and a metal evaporation source according to the metal components of each layer is evaporated via an arc discharge of from 35 A to 80 A, whereby formation of a composite nitride layer on the surface of the substrate or the surface of a lower layer starts.

Here, in the composite nitride layer of the present embodiment, to form a phase having the lattice constant of from 0.400 nm or more to 0.430 nm or less, a metal evaporation source whose atomic ratio of the Al element based on a total of the Ti element and the Al element is from 0.50 or more to 0.90 or less is preferably used. Further, in the composite nitride layer of the present embodiment, to form a phase having the lattice constant of from 0.755 nm or more to 0.810 nm or less, the composite nitride layer is preferably formed under the following conditions: the metal evaporation source whose atomic ratio of the Al element based on a total of the Ti element and the Al element is from 0.50 or more to 0.90 or less is used; the temperature of the substrate is set low, specifically, is set to from 150° C. to 400° C.; and an atmosphere in the reactor of the physical vapor deposition apparatus is set to an atmosphere of a mixed gas including a $N_2$ gas, an Ar gas, and a Xe gas. Here, when the proportion of the Xe gas in the reactor increases, the lattice constant tends to increase.

The hexagonal crystal I (100)/cubic crystal I (200) in the composite nitride layer of the present embodiment may be set to a desired value by setting the temperature of the substrate to be low in the process of forming the composite nitride layer described above. Further, when a metal evaporation source having a small atomic ratio of the Al element based on a total of the Ti element and the Al element is used, the abundance ratio of the hexagonal crystal in the composite nitride layer tends to be small. Thus, the hexagonal crystal I (100)/cubic crystal I (200) can be controlled by adjusting the temperature of the substrate and the composition of the metal evaporation source.

The compressive stress given to the composite nitride layer of the present embodiment may be set to a predetermined value by increasing the absolute value of the bias voltage applied to the substrate, in the process of forming the composite nitride layer described above. More specifically, when a case where the bias voltage is −50 V and a case where the bias voltage is −100 V are compared to each other, in the case where the bias voltage is −100 V, the absolute value of the bias voltage is large, and the compressive stress given to the composite nitride layer is thus large. Further, when a metal evaporation source having a small atomic ratio of the Al element based on a total of the Ti element and the Al element is used, the compressive stress in the composite nitride layer tends to be large. Thus, the compressive stress can be controlled by adjusting the bias voltage and the composition of the metal evaporation source.

The thickness of each layer forming the coating layer in the coated cutting tool of the present embodiment can be measured from a cross-sectional structure of the coated cutting tool using an optical microscope, a scanning electron microscope (SEM), a TEM, or the like. The average thickness of each layer in the coated cutting tool of the present embodiment can be obtained by measuring the thickness of each layer from cross-sectional surfaces at three or more locations near the position 50 μm from the edge of a surface facing the metal evaporation source, toward the center of the surface, and calculating the average value (arithmetic mean) thereof.

Further, the composition of each layer forming the coating layer in the coated cutting tool of the present embodiment can be measured from a cross-sectional structure of the coated cutting tool of the present embodiment using an energy dispersive X-ray spectrometry (EDS) apparatus, a wavelength dispersive X-ray spectroscopy (WDS) apparatus, or the like.

It is considered that the coated cutting tool of the present embodiment has excellent wear resistance and fracture resistance, and hence provides an effect to achieve a longer tool life than conventional ones (factors for enabling the tool life to be extended are not limited to the matters described above). As the types of the coated cutting tool of the present embodiment, specifically, indexable cutting insert for milling or turning, a drill, and an end mill are given, for example.

Example

Now, the present invention is more specifically described by means of Examples, but the present invention is not limited to Examples.

A machined cemented carbide insert with a shape of ISO certified SEEN1203AGTN and a composition of 90.0WC-10.0Co (mass %) was prepared as a substrate. In a reactor of an arc ion plating apparatus, a metal evaporation source was arranged so as to achieve the composition of each layer shown in Table 1 and Table 2. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature thereof reached 450° C. After the heating, an Ar gas was introduced into the reactor so that the pressure therein reached 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out on the surface of the substrate with the Ar gas for 30 minutes. After the ion bombardment process was carried out, the reactor was evacuated until the pressure therein indicated a vacuum of $5.0 \times 10^{-3}$ Pa or lower.

In invention samples 1 to 10, after the evacuation, the substrate was controlled so that the temperature thereof reached a temperature (temperature at the start of film formation) shown in Table 3, and a gas having a composition shown in Table 3 was introduced into the reactor so that a gas condition that the reactor had a pressure shown in Table 3 was satisfied.

In invention samples 1 to 10, a composite nitride layer was formed on the surface of the substrate as follows: without formation of a lower layer, a bias voltage shown in Table 3 was applied to the substrate, and a metal evaporation source having a composition shown in Table 1 was evaporated via an arc discharge of an arc current shown in Table 3.

In invention samples 11 to 14, after the evacuation, a $N_2$ gas was introduced so that the pressure in the reactor reached 3.0 Pa. Thereafter, a bias voltage of −50 V was applied to the substrate, and a metal evaporation source having a composition shown in Table 1 was evaporated via an arc discharge of an arc current of 120 A, whereby the lower layer was formed on the surface of the substrate.

Then, in invention samples 11 to 14, the substrate was controlled so that the temperature thereof reached a temperature (temperature at the start of film formation) shown in Table 3, and a gas having a composition shown in Table 3 was introduced into the reactor so that a gas condition that the reactor had a pressure shown in Table 3 was satisfied. Thereafter, a bias voltage shown in Table 3 was applied to the substrate, and a metal evaporation source having a composition shown in Table 1 was evaporated via an arc discharge of an arc current shown in Table 3, whereby the composite nitride layer was formed on the surface of the lower layer.

In addition, in invention samples 11 to 14, after the composite nitride layer was formed, a $N_2$ gas was introduced so that the pressure in the reactor reached 3.0 Pa. A bias voltage of −50 V was applied to the substrate, and a metal evaporation source having a composition shown in Table 1 was evaporated via an arc discharge of an arc current of 120 A, whereby an upper layer was formed on the surface of the composite nitride layer.

In comparative samples 1 to 4, after the evacuation, the substrate was controlled so that the temperature thereof reached a temperature (temperature at the start of film formation) shown in Table 3, and a gas having a composition shown in Table 3 was introduced into the reactor so that a gas condition that the reactor had a pressure shown in Table 3 was satisfied.

In comparative samples 1 to 4, a bias voltage shown in Table 3 was applied to the substrate, and a metal evaporation source having a composition shown in Table 2 was evaporated via an arc discharge of an arc current shown in Table 3, whereby a first layer was formed on the surface of the substrate.

In comparative samples 5 to 7, after the evacuation, a $N_2$ gas was introduced so that the pressure in the reactor reached 3.0 Pa. Thereafter, a bias voltage of −50 V was applied to the substrate, and a metal evaporation source having a composition shown in Table 2 was evaporated via an arc discharge of an arc current of 120 A, whereby the first layer was formed.

Then, in comparative samples 5 to 7, the substrate was controlled so that the temperature thereof reached a temperature (temperature at the start of film formation) shown in Table 3, and a gas having a composition shown in Table 3 was introduced into the reactor so that a gas condition that the reactor had a pressure shown in Table 3 was satisfied. Thereafter, a bias voltage shown in Table 3 was applied to the substrate, and a metal evaporation source having a composition shown in Table 2 was evaporated via an arc discharge of an arc current shown in Table 3, whereby a second layer was formed on the surface of the first layer.

In comparative samples 5 to 7, after the second layer was formed, a $N_2$ gas was introduced so that the pressure in the reactor reached 3.0 Pa. A bias voltage of −50 V was applied to the substrate, and a metal evaporation source having a composition shown in Table 2 was evaporated via an arc discharge of an arc current of 120 A, whereby a third layer was formed.

After each layer was formed on the surface of the substrate to have a predetermined average thickness shown in Table 1 and Table 2, the heater was powered off. The sample was taken out of the reactor after the temperature of the sample reached 100° C. or lower.

TABLE 1

| | Coating layer | | | | | | |
|---|---|---|---|---|---|---|---|
| | Lower layer | | Composite nitride layer | | Upper layer | | Average |
| Sample No. | Composition | Average thickness (μm) | Composition | Average thickness (μm) | Composition | Average thickness (μm) | thickness of entire layer (μm) |
| Invention sample 1 | — | — | $(Ti_{0.35}Al_{0.65})N$ | 3.0 | — | — | 3.0 |
| Invention sample 2 | — | — | $(Ti_{0.25}Al_{0.75})N$ | 3.0 | — | — | 3.0 |
| Invention sample 3 | — | — | $(Ti_{0.15}Al_{0.85})N$ | 3.0 | — | — | 3.0 |
| Invention sample 4 | — | — | $(Ti_{0.25}Al_{0.75})N$ | 1.7 | — | — | 1.7 |
| Invention sample 5 | — | — | $(Ti_{0.25}Al_{0.75})N$ | 4.8 | — | — | 4.8 |
| Invention sample 6 | — | — | $(Ti_{0.25}Al_{0.75})N$ | 6.0 | — | — | 6.0 |
| Invention sample 7 | — | — | $(Ti_{0.25}Al_{0.75})N$ | 8.0 | — | — | 8.0 |
| Invention sample 8 | — | — | $(Ti_{0.30}Al_{0.70})N$ | 10.5 | — | — | 10.5 |
| Invention sample 9 | — | — | $(Ti_{0.30}Al_{0.70})N$ | 4.2 | — | — | 4.2 |
| Invention sample 10 | — | — | $(Ti_{0.20}Al_{0.80})N$ | 4.2 | — | — | 4.2 |
| Invention sample 11 | $(Ti_{0.65}Al_{0.35})N$ | 0.5 | $(Ti_{0.30}Al_{0.70})N$ | 2.5 | $(Ti_{0.65}Al_{0.35})N$ | 1.0 | 4.0 |
| Invention sample 12 | $(Ti_{0.20}Al_{0.30}Nb_{0.20}W_{0.20}Mo_{0.10})N$ | 0.3 | $(Ti_{0.30}Al_{0.70})N$ | 2.0 | NbN | 0.3 | 2.6 |
| Invention sample 13 | $(Al_{0.50}Cr_{0.30}Si_{0.20})N$ | 2.0 | $(Ti_{0.25}Al_{0.75})N$ | 5.5 | $(Ti_{0.20}Al_{0.30}Nb_{0.20}W_{0.20}Mo_{0.10})N$ | 2.0 | 9.5 |
| Invention sample 14 | $(Al_{0.50}Cr_{0.30}V_{0.20})N$ | 1.0 | $(Ti_{0.15}Al_{0.85})N$ | 3.0 | $(Al_{0.50}Cr_{0.30}Si_{0.20})N$ | 1.5 | 5.5 |

* "—" in the field "Composition" or "Average thickness" means that the lower layer or the upper layer is not formed.

TABLE 2

| | Coating layer | | | | | | | Average thickness of entire layer (μm) |
|---|---|---|---|---|---|---|---|---|
| | First layer | | Second layer | | Third layer | | | |
| Sample No. | Composition | Average thickness (μm) | Composition | Average thickness (μm) | Composition | Average thickness (μm) | | |
| Comparative sample 1 | $(Ti_{0.50}Al_{0.50})N$ | 3.0 | — | — | — | — | | 3.0 |
| Comparative sample 2 | $(Ti_{0.30}Al_{0.70})N$ | 3.0 | — | — | — | — | | 3.0 |
| Comparative sample 3 | $(Ti_{0.20}Al_{0.80})N$ | 4.5 | — | — | — | — | | 4.5 |
| Comparative sample 4 | $(Ti_{0.35}Al_{0.65})N$ | 3.0 | — | — | — | — | | 3.0 |
| Comparative sample 5 | $(Ti_{0.65}Al_{0.35})N$ | 0.5 | $(Ti_{0.35}Al_{0.65})N$ | 1.5 | $(Ti_{0.65}Al_{0.35})N$ | 1.0 | | 3.0 |
| Comparative sample 6 | $(Ti_{0.20}Al_{0.30}Nb_{0.20}W_{0.20}Mo_{0.10})N$ | 0.3 | $(Ti_{0.40}Al_{0.60})N$ | 4.5 | NbN | 0.7 | | 5.5 |
| Comparative sample 7 | $(Al_{0.50}Cr_{0.30}V_{0.20})N$ | 1.0 | $(Ti_{0.35}Al_{0.65})N$ | 6.0 | $(Ti_{0.20}Al_{0.30}Nb_{0.20}W_{0.20}Mo_{0.10})N$ | 2.0 | | 9.0 |

* "—" in the field "Composition" or "Average thickness" means that the second layer and the third layer are not formed.

TABLE 3

| | Gas conditions | | | | | |
|---|---|---|---|---|---|---|
| Sample No. | Temperature (°C.) | Pressure (Pa) | $N_2$ (vol %) | Ar (vol %) | Xe (vol %) | Bias voltage (V) | Arc current (A) |
| Invention sample 1 | 150 | 2.0 | 50 | 46 | 4 | −40 | 40 |
| Invention sample 2 | 200 | 2.0 | 50 | 48 | 2 | −50 | 40 |
| Invention sample 3 | 250 | 2.0 | 50 | 48 | 2 | −50 | 60 |
| Invention sample 4 | 200 | 3.0 | 50 | 46 | 4 | −60 | 60 |
| Invention sample 5 | 400 | 3.0 | 50 | 46 | 4 | −60 | 80 |
| Invention sample 6 | 350 | 3.0 | 50 | 49.5 | 0.5 | −70 | 80 |
| Invention sample 7 | 300 | 3.0 | 50 | 48 | 2 | −100 | 60 |
| Invention sample 8 | 250 | 4.0 | 30 | 62 | 8 | −100 | 60 |
| Invention sample 9 | 200 | 4.0 | 30 | 60 | 10 | −70 | 35 |
| Invention sample 10 | 200 | 4.0 | 30 | 60 | 10 | −40 | 35 |
| Invention sample 11 | 300 | 4.0 | 30 | 62 | 8 | −60 | 60 |
| Invention sample 12 | 300 | 4.0 | 30 | 62 | 8 | −50 | 60 |
| Invention sample 13 | 300 | 4.0 | 30 | 64 | 6 | −80 | 60 |
| Invention sample 14 | 350 | 4.0 | 30 | 64 | 6 | −70 | 60 |
| Comparative sample 1 | 250 | 2.0 | 100 | 0 | 0 | −70 | 60 |
| Comparative sample 2 | 500 | 2.0 | 100 | 0 | 0 | −60 | 60 |
| Comparative sample 3 | 500 | 3.0 | 100 | 0 | 0 | −60 | 60 |
| Comparative sample 4 | 500 | 3.0 | 50 | 50 | 0 | −70 | 40 |
| Comparative sample 5 | 500 | 3.0 | 50 | 50 | 0 | −70 | 80 |
| Comparative sample 6 | 250 | 3.0 | 30 | 70 | 0 | −70 | 40 |
| Comparative sample 7 | 500 | 3.0 | 30 | 70 | 0 | −70 | 80 |

The average thickness of each layer of the obtained sample was obtained by observing, with a SEM, cross-sectional surfaces at three locations near the position 50 μm from the edge of a surface of the coated cutting tool facing the metal evaporation source, toward the center of the surface to measure the thickness of each layer, and calculating the average value (arithmetic mean) thereof. The composition of each layer of the obtained sample was measured using an EDS from a cross-sectional surface near the position 50 μm from the edge of a surface of the coated cutting tool facing the metal evaporation source, toward the center of the surface. The results are also shown in Table 1 and Table 2. The composition ratio of the metal element of each layer in Table 1 and Table 2 represents the atomic ratio of each metal element with respect to all metal elements of the metal compound forming each layer.

The lattice constant and the crystal system of the obtained sample were derived using a commercially available TEM. A thin-film sample having an observation surface being a cross-sectional surface of the coating layer was produced using the FIB machining apparatus manufactured by FEI Company. Then, a lattice image of the composite nitride layer was taken at a magnification of 500,000 using the TEM apparatus Tecnai Osiris (product name) manufactured by FEI Company. An FFT image was obtained from the taken image using the analysis software manufactured by Gatan, Inc. Lattice spacing was derived from a distance between an intensity (center spot) obtained at the center of the FFT image and a diffraction spot, and the crystal system and the lattice constant were obtained. The results are shown in Table 4 and Table 5. With regard to comparative sample, the lattice constant of the (Ti,Al)N layer having the largest average thickness was measured.

TABLE 4

| | Composite nitride layer | | | |
|---|---|---|---|---|
| | Phase 1 | | Phase 2 | |
| Sample No. | Crystal system | Lattice constant (nm) | Crystal system | Lattice constant (nm) |
| Invention sample 1 | Cubic crystal | 0.420 | Cubic crystal | 0.772 |
| Invention sample 2 | Cubic crystal | 0.415 | Cubic crystal | 0.768 |
| Invention sample 3 | Cubic crystal | 0.411 | Cubic crystal | 0.769 |
| Invention sample 4 | Cubic crystal | 0.415 | Cubic crystal | 0.776 |

TABLE 4-continued

| | Composite nitride layer | | | |
|---|---|---|---|---|
| | Phase 1 | | Phase 2 | |
| Sample No. | Crystal system | Lattice constant (nm) | Crystal system | Lattice constant (nm) |
| Invention sample 5 | Cubic crystal | 0.415 | Cubic crystal | 0.779 |
| Invention sample 6 | Cubic crystal | 0.415 | Cubic crystal | 0.761 |
| Invention sample 7 | Cubic crystal | 0.415 | Cubic crystal | 0.770 |
| Invention sample 8 | Cubic crystal | 0.418 | Cubic crystal | 0.785 |
| Invention sample 9 | Cubic crystal | 0.418 | Cubic crystal | 0.792 |
| Invention sample 10 | Cubic crystal | 0.413 | Cubic crystal | 0.797 |
| Invention sample 11 | Cubic crystal | 0.417 | Cubic crystal | 0.786 |
| Invention sample 12 | Cubic crystal | 0.417 | Cubic crystal | 0.785 |
| Invention sample 13 | Cubic crystal | 0.415 | Cubic crystal | 0.781 |
| Invention sample 14 | Cubic crystal | 0.410 | Cubic crystal | 0.782 |

TABLE 5

| | First layer or second layer | | | |
|---|---|---|---|---|
| | Phase 1 | | Phase 2 | |
| Sample No. | Crystal system | Lattice constant (nm) | Crystal system | Lattice constant (nm) |
| Comparative sample 1 | Cubic crystal | 0.422 | None | None |
| Comparative sample 2 | Cubic crystal | 0.416 | Hexagonal crystal | a = b = 3.114, c = 4.978 |
| Comparative sample 3 | Cubic crystal | 0.412 | Hexagonal crystal | a = b = 3.114, c = 4.979 |
| Comparative sample 4 | Cubic crystal | 0.420 | None | None |
| Comparative sample 5 | Cubic crystal | 0.421 | None | None |
| Comparative sample 6 | Cubic crystal | 0.423 | None | None |
| Comparative sample 7 | Cubic crystal | 0.420 | None | None |

With regard to the obtained sample, X-ray diffraction by a 2θ/θ focusing optical system with Cu-Kα radiation was measured under the following conditions: an output: 50 kV and 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 15° to 80°. As the apparatus, the X-ray diffractometer RINT TTRIII (product name) manufactured by Rigaku Corporation was used. The diffraction peak intensity of each plane index of the composite nitride layer was obtained from the X-ray diffraction pattern. From the obtained diffraction peak intensity of each plane index, hexagonal crystal I (100)/cubic crystal I (200) was obtained. The results are shown in Table 6 and Table 7. When the lower layer was formed on the substrate side of the composite nitride layer, each diffraction peak intensity was measured by thin film X-ray diffraction so that the lower layer did not affect the measurement. Further, when the upper layer was formed on the front surface side (a side opposed to the substrate) of the composite nitride layer, the X-ray diffraction was measured after the upper layer was removed by buffing so that the upper layer did not affect the measurement. With regard to comparative sample, the hexagonal crystal I (100)/cubic crystal I (200) of the (Ti,Al)N layer having the largest average thickness was obtained.

TABLE 6

| Sample No. | Composite nitride layer Hexagonal crystal I (100)/cubic crystal I (200) |
|---|---|
| Invention sample 1 | 0.00 |
| Invention sample 2 | 0.25 |
| Invention sample 3 | 0.48 |
| Invention sample 4 | 0.28 |
| Invention sample 5 | 0.35 |
| Invention sample 6 | 0.31 |
| Invention sample 7 | 0.24 |
| Invention sample 8 | 0.10 |
| Invention sample 9 | 0.06 |
| Invention sample 10 | 0.45 |
| Invention sample 11 | 0.14 |
| Invention sample 12 | 0.17 |
| Invention sample 13 | 0.23 |
| Invention sample 14 | 0.55 |

TABLE 7

| Sample No. | First layer or second layer Hexagonal crystal I (100)/cubic crystal I (200) |
|---|---|
| Comparative sample 1 | 0.00 |
| Comparative sample 2 | 1.35 |
| Comparative sample 3 | 5.20 |
| Comparative sample 4 | 0.00 |
| Comparative sample 5 | 0.00 |
| Comparative sample 6 | 0.00 |
| Comparative sample 7 | 0.00 |

With regard to the obtained sample, compressive stress in the composite nitride layer was measured by the $\sin^2\psi$ method using the X-ray diffractometer. As the compressive stress in the composite nitride layer, stresses at any ten points in a section involved in cutting were measured, and the average value (arithmetic mean) thereof was obtained. With regard to comparative sample, the compressive stress in the (Ti,Al)N layer having the largest average thickness was obtained. The results are shown in Table 8 and Table 9.

TABLE 8

| Sample No. | Composite nitride layer Residual stress (GPa) |
|---|---|
| Invention sample 1 | 1.8 |
| Invention sample 2 | 1.3 |
| Invention sample 3 | 1.2 |
| Invention sample 4 | 0.1 |
| Invention sample 5 | -0.5 |
| Invention sample 6 | -1.1 |
| Invention sample 7 | -3.6 |
| Invention sample 8 | -4.2 |
| Invention sample 9 | -1.4 |
| Invention sample 10 | 2.2 |
| Invention sample 11 | 0.5 |
| Invention sample 12 | 0.9 |
| Invention sample 13 | -2.0 |
| Invention sample 14 | -0.8 |

TABLE 9

| Sample No. | First layer or second layer Residual stress (GPa) |
|---|---|
| Comparative sample 1 | -1.1 |
| Comparative sample 2 | -0.2 |
| Comparative sample 3 | -0.3 |
| Comparative sample 4 | -1.5 |

TABLE 9-continued

| Sample No. | First layer or second layer Residual stress (GPa) |
|---|---|
| Comparative sample 5 | −0.7 |
| Comparative sample 6 | −0.8 |
| Comparative sample 7 | −1.2 |

The following cutting test was performed using the obtained sample, and evaluation was made.

[Cutting Test: Wear Resistance Test]
Workpiece: SCM440
Workpiece shape: Rectangular parallelepiped of 120 mm×230 mm×60 mm
Cutting speed: 250 m/min
Feed: 0.15 mm/tooth
Depth of cut: 2.0 mm
Coolant: Not used
Width of cut: 50 mm
Evaluation items: A time at which the sample had the largest flank wear width of 0.2 mm was defined as the end of the tool life, and the machining length to reach the end of the tool life was measured.

[Cutting Test: Fracture Resistance Test]
Workpiece: SCM440
Workpiece shape: Rectangular parallelepiped of 120 mm×230 mm×60 mm (the 120 mm×230 mm surface of the rectangular parallelepiped on which face milling was performed was provided with four holes each having a diameter of φ30 mm)
Cutting speed: 250 m/min
Feed: 0.40 mm/tooth
Depth of cut: 2.0 mm,
Coolant: Not used
Width of cut: 105 mm
Evaluation items: A time at which the sample was fractured (cracks were caused in the cutting edge portion of the sample) was defined as the end of the tool life, and the machining length to reach the end of the tool life was measured.

With regard to the machining length to reach the end of the tool life in the wear resistance test, a length of 10.5 m or more was evaluated as "A", a length of from 9.5 m or more to less than 10.5 m was evaluated as "B", and a length of less than 9.5 m was evaluated as "C". Further, with regard to the machining length to reach the end of the tool life in the fracture resistance test, a length of 5.5 m or more was evaluated as "A", a length of from 4.5 m or more to less than 5.5 m was evaluated as "B", and a length of less than 4.5 m was evaluated as "C". In this evaluation, "A" means that the resistance is most excellent, "B" means that the resistance is second excellent, and "C" means that the resistance is poorest. When a sample gets "A" or "B", it means that the sample is excellent in cutting performance. The obtained evaluation results are shown in Table 1 0.

TABLE 10

| | Cutting test | | | |
|---|---|---|---|---|
| | Wear resistance test | | Fracture resistance test | |
| Sample No. | Machining length (m) | Evaluation | Machining length (m) | Evaluation |
| Invention sample 1 | 10.1 | B | 4.8 | B |
| Invention sample 2 | 10.0 | B | 4.7 | B |
| Invention sample 3 | 9.7 | B | 5.0 | B |
| Invention sample 4 | 9.5 | B | 4.8 | B |
| Invention sample 5 | 10.8 | A | 6.4 | A |
| Invention sample 6 | 11.1 | A | 6.0 | A |
| Invention sample 7 | 11.5 | A | 5.8 | A |
| Invention sample 8 | 12.0 | A | 5.2 | B |
| Invention sample 9 | 10.6 | A | 7.0 | A |
| Invention sample 10 | 10.2 | B | 4.6 | B |
| Invention sample 11 | 10.8 | A | 6.5 | A |
| Invention sample 12 | 10.0 | B | 6.7 | A |
| Invention sample 13 | 11.2 | A | 5.7 | A |
| Invention sample 14 | 10.7 | A | 6.5 | A |
| Comparative sample 1 | 10.0 | B | 3.6 | C |
| Comparative sample 2 | 7.4 | C | 4.0 | C |
| Comparative sample 3 | 7.0 | C | 3.8 | C |
| Comparative sample 4 | 9.4 | C | 4.1 | C |
| Comparative sample 5 | 10.1 | B | 3.9 | C |
| Comparative sample 6 | 10.2 | B | 3.8 | C |
| Comparative sample 7 | 10.4 | B | 3.5 | C |

From the results shown in Table 1 0, in the wear resistance test, all invention samples got the evaluation results of B or higher, whereas comparative samples got the evaluation results of B or C. Thus, it is found that the wear resistance of invention sample is equal to or higher than that of comparative sample.

Further, in the fracture resistance test, all invention samples got the evaluation results of A or B, whereas all comparative samples got the evaluation results of C.

From the results described above, it is found that the tool life of invention sample is extended through the improvement of fracture resistance without a reduction in wear resistance.

The present application is based on the Japanese patent application filed on Mar. 31, 2016 (Japanese Patent Application No. 2016-070038), the content of which is incorporated herein by reference.

INDUSTRIAL APPLICABILITY

The tool life of the coated cutting tool of the present invention can be extended compared to the conventional ones, and hence the coated cutting tool has high industrial applicability.

What is claimed is:

1. A coated cutting tool, comprising:
a substrate; and
a coating layer formed on at least part of a surface of the substrate, wherein, the coating layer includes at least one composite nitride layer including a compound having a composition represented by formula (1) below:

$$(Ti_xAl_y)N \quad (1)$$

(wherein, x denotes an atomic ratio of a Ti element based on a total of the Ti element and an Al element, y denotes an atomic ratio of the Al element based on a total of the Ti element and the Al element, and $0.10 \leq x \leq 0.50$, $0.50 \leq y \leq 0.90$, and x+y=1 are satisfied); and
the composite nitride layer includes a phase having a lattice constant of from 0.400 nm or more to 0.430 nm or less, and a phase having a lattice constant of from 0.755 nm or more to 0.810 nm or less.

2. The coated cutting tool according to claim 1, wherein the composite nitride layer includes a phase having a crystal system of a cubic crystal and a lattice constant of from 0.410 nm or more to 0.430 nm or less, and a phase having a crystal system of a cubic crystal and a lattice constant of from 0.760 nm or more to 0.800 nm or less.

3. The coated cutting tool according to claim 1, wherein the composite nitride layer includes a phase having a lattice constant of from 0.410 nm or more to 0.420 nm or less, and a phase having a lattice constant of from 0.770 nm or more to 0.795 nm or less.

4. The coated cutting tool according to claim 1, wherein, the composite nitride layer includes a crystal of (Ti,Al)N, which is a cubic crystal, or the crystal of (Ti,Al)N, which is the cubic crystal, and a crystal of AlN, which is a hexagonal crystal; and
a ratio [hexagonal crystal I (100)/cubic crystal I (200)] of a diffraction peak intensity I (100) of a hexagonal crystal plane (100) to a diffraction peak intensity I (200) of a cubic crystal plane (200), which is obtained through X-ray diffraction, is 0.5 or less.

5. The coated cutting tool according to claim 1, wherein the composite nitride layer has a residual stress of from −4.0 GPa or higher to 2.0 GPa or lower.

6. The coated cutting tool according to claim 1, wherein the composite nitride layer has an average thickness of from 1.5 μm or more to 12.0 μm or less.

7. The coated cutting tool according to claim 1, wherein, the coating layer includes a lower layer between the substrate and the composite nitride layer;
the lower layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the lower layer has an average thickness of from 0.1 μm or more to 3.5 μm or less.

8. The coated cutting tool according to claim 1, wherein, the coating layer includes an upper layer on an opposite side of the composite nitride layer to the substrate;
the upper layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the upper layer has an average thickness of from 0.1 μm or more to 3.5 μm or less.

9. The coated cutting tool according to claims 1, wherein an entire coating layer has an average thickness of from 1.5 μm or more to 15.0 μm or less.

10. The coated cutting tool according to claim 1, wherein the substrate is a cemented carbide, cermet, ceramics, or a cubic boron nitride sintered body.

11. The coated cutting tool according to claim 2, wherein the composite nitride layer includes a phase having a lattice constant of from 0.410 nm or more to 0.420 nm or less, and a phase having a lattice constant of from 0.770 nm or more to 0.795 nm or less.

12. The coated cutting tool according to claim 2, wherein, the composite nitride layer includes a crystal of (Ti,Al)N, which is a cubic crystal, or the crystal of (Ti,Al)N, which is the cubic crystal, and a crystal of AlN, which is a hexagonal crystal; and
a ratio [hexagonal crystal I (100)/cubic crystal I (200)] of a diffraction peak intensity I (100) of a hexagonal crystal plane (100) to a diffraction peak intensity I (200) of a cubic crystal plane (200), which is obtained through X-ray diffraction, is 0.5 or less.

13. The coated cutting tool according to claim 3, wherein, the composite nitride layer includes a crystal of (Ti,Al)N, which is a cubic crystal, or the crystal of (Ti,Al)N, which is the cubic crystal, and a crystal of AlN, which is a hexagonal crystal; and
a ratio [hexagonal crystal I (100)/cubic crystal I (200)] of a diffraction peak intensity I (100) of a hexagonal crystal plane (100) to a diffraction peak intensity I (200) of a cubic crystal plane (200), which is obtained through X-ray diffraction, is 0.5 or less.

14. The coated cutting tool according to claim 2, wherein the composite nitride layer has a residual stress of from −4.0 GPa or higher to 2.0 GPa or lower.

15. The coated cutting tool according to claim 3, wherein the composite nitride layer has a residual stress of from −4.0 GPa or higher to 2.0 GPa or lower.

16. The coated cutting tool according to claim 4, wherein the composite nitride layer has a residual stress of from −4.0 GPa or higher to 2.0 GPa or lower.

17. The coated cutting tool according to claim 2, wherein, the coating layer includes a lower layer between the substrate and the composite nitride layer;
the lower layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the lower layer has an average thickness of from 0.1 μm or more to 3.5 μm or less.

18. The coated cutting tool according to claim 4, wherein, the coating layer includes a lower layer between the substrate and the composite nitride layer;
the lower layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the lower layer has an average thickness of from 0.1 μm or more to 3.5 μm or less.

19. The coated cutting tool according to claim 2, wherein, the coating layer includes an upper layer on an opposite side of the composite nitride layer to the substrate;
the upper layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and
the upper layer has an average thickness of from 0.1 μm or more to 3.5 μm or less.

20. The coated cutting tool according to claim 5, wherein, the coating layer includes an upper layer on an opposite side of the composite nitride layer to the substrate;
the upper layer is formed of a single layer or a laminate including a compound containing an element of at least one kind selected from the group consisting of Ti, Zr, Hf, V, Nb, Ta, Cr, Mo, W, Al, Si, and Y, and an element of at least one kind selected from the group consisting of C, N, O, and B; and the upper layer has an average thickness of from 0.1 μm or more to 3.5 μm or less.

* * * * *